US007974333B2

(12) United States Patent
Maeda

(10) Patent No.: US 7,974,333 B2
(45) Date of Patent: Jul. 5, 2011

(54) SEMICONDUCTOR APPARATUS AND RADIO CIRCUIT APPARATUS USING THE SAME

(75) Inventor: Masakatsu Maeda, Kyoto (JP)

(73) Assignee: Panasonic Corporation, Osaka (JP)

( * ) Notice: Subject to any disclaimer, the term of this patent is extended or adjusted under 35 U.S.C. 154(b) by 767 days.

(21) Appl. No.: 11/994,542

(22) PCT Filed: Jun. 27, 2006

(86) PCT No.: PCT/JP2006/312776
§ 371 (c)(1),
(2), (4) Date: Jan. 3, 2008

(87) PCT Pub. No.: WO2007/004465
PCT Pub. Date: Jan. 11, 2007

(65) Prior Publication Data
US 2009/0115466 A1      May 7, 2009

(30) Foreign Application Priority Data

Jul. 4, 2005   (JP) ................................ 2005-195340

(51) Int. Cl.
*H04B 1/38* (2006.01)
(52) U.S. Cl. ........ 375/222; 375/243; 375/316; 375/295; 327/101; 327/113; 327/115; 327/116; 327/124; 327/117
(58) Field of Classification Search .................. 327/101, 327/113, 115, 116, 117, 124; 375/222, 243, 375/316, 295
See application file for complete search history.

(56) References Cited

U.S. PATENT DOCUMENTS 4,965,531 A * 10/1990 Riley ............................ 331/1 A
(Continued)

FOREIGN PATENT DOCUMENTS

CN         1092568         9/1994
(Continued)

OTHER PUBLICATIONS

Matsuya et al., "A 17-bit Oversampling D-to-A Conversion Technology using Multistage Noise Shaping," IEEE Journal of Solid-State Circuits, vol. 24, No. 4, Aug. 1989, pp. 8971, Fig 4.

*Primary Examiner* — Chieh M Fan
*Assistant Examiner* — Siu M Lee
(74) *Attorney, Agent, or Firm* — Hamre, Schumann, Mueller & Larson, P.C.

(57) ABSTRACT

A semiconductor apparatus includes a signal source 7 that outputs a signal of predetermined frequency, a frequency divider 15 that receives the output signal of the signal source and is capable of switching the output signal to two or more frequency division ratios, a delta-sigma modulator 16 that controls the frequency division ratio of the frequency divider, and a bandpass filter 17 that receives an output of the frequency divider. The frequency of the input signal of the frequency divider is divided by the frequency division ratio controlled by the delta-sigma modulator, and quantization noise appearing in the output of the frequency divider generated by the delta-sigma modulator is attenuated with the bandpass filter. The semiconductor apparatus easily can convert a signal output by a single signal source to a signal of predetermined frequency and supply a plurality of signals of predetermined frequency using a simple configuration with reduced chip size.

17 Claims, 12 Drawing Sheets

U.S. PATENT DOCUMENTS

| | | | | |
|---|---|---|---|---|
| 5,027,120 | A * | 6/1991 | Thurston | 341/143 |
| 5,182,478 | A | 1/1993 | Nomura | |
| 5,450,028 | A * | 9/1995 | Therssen | 327/91 |
| 5,574,998 | A * | 11/1996 | Andoh | 455/182.2 |
| 5,606,280 | A * | 2/1997 | Sohn | 327/553 |
| 5,948,046 | A * | 9/1999 | Hagberg | 708/103 |
| 6,002,926 | A * | 12/1999 | Shiraishi | 455/314 |
| 6,084,486 | A | 7/2000 | Suzuki et al. | |
| 7,110,486 | B2 * | 9/2006 | Adachi et al. | 375/376 |
| 2002/0061086 | A1 | 5/2002 | Adachi et al. | |
| 2004/0012423 | A1 | 1/2004 | Maeda | |
| 2004/0085103 | A1 * | 5/2004 | Ahn et al. | 327/156 |
| 2004/0108910 | A1 * | 6/2004 | Feilkas et al. | 331/117 R |
| 2004/0207437 | A1 | 10/2004 | Shibahara et al. | |
| 2005/0124377 | A1 * | 6/2005 | Shih et al. | 455/552.1 |
| 2005/0163253 | A1 * | 7/2005 | Matsuura et al. | 375/297 |
| 2006/0038708 | A1 * | 2/2006 | Luh et al. | 341/143 |
| 2006/0055467 | A1 * | 3/2006 | Ochi et al. | 331/16 |

FOREIGN PATENT DOCUMENTS

| | | |
|---|---|---|
| CN | 1289479 | 3/2001 |
| JP | 51-74555 | 6/1976 |
| JP | 2-296415 | 12/1990 |
| JP | 5-243995 | 9/1993 |
| JP | 7-38424 | 2/1995 |
| JP | 7-33031 | 6/1995 |
| JP | 2001-237709 | 8/2001 |
| WO | WO9940679 A1 | 8/1999 |

* cited by examiner

| | t0 | t1 | t2 | t3 | t4 | t5 | t6 | t7 | t8 | t9 | t10 | t11 | t12 | t13 | t14 | t15 | t16 | t17 | t18 | t19 | t20 | t21 | t22 | t23 | t24 | t25 | t26 | t27 | t28 | t29 | t30 | t31 |
|---|---|---|---|---|---|---|---|---|---|---|---|---|---|---|---|---|---|---|---|---|---|---|---|---|---|---|---|---|---|---|---|---|
| L | 32 | 32 | 32 | 32 | 32 | 32 | 32 | 32 | 32 | 32 | 32 | 32 | 32 | 32 | 32 | 32 | 32 | 32 | 32 | 32 | 32 | 32 | 32 | 32 | 32 | 32 | 32 | 32 | 32 | 32 | 32 | 32 |
| K | 3 | 3 | 3 | 3 | 3 | 3 | 3 | 3 | 3 | 3 | 3 | 3 | 3 | 3 | 3 | 3 | 3 | 3 | 3 | 3 | 3 | 3 | 3 | 3 | 3 | 3 | 3 | 3 | 3 | 3 | 3 | 3 |
| Data latch 23 output | 3 | 3 | 3 | 3 | 3 | 3 | 3 | 3 | 3 | 3 | 3 | 3 | 3 | 3 | 3 | 3 | 3 | 3 | 3 | 3 | 3 | 3 | 3 | 3 | 3 | 3 | 3 | 3 | 3 | 3 | 3 | 3 |
| Integrator 24 input | 0 | 0 | 3 | 3 | 3 | 3 | 3 | 3 | 3 | 3 | 3 | 3 | 3 | 3 | 3 | 3 | 3 | 3 | -61 | 35 | 3 | 3 | 3 | 3 | 3 | 3 | 3 | 3 | -61 | 35 | 3 | 3 |
| Integrator 24 data latch | 0 | 0 | 3 | 6 | 9 | 12 | 15 | -46 | -11 | -8 | -5 | -2 | 1 | 4 | 7 | 10 | 13 | 16 | 19 | -42 | -7 | -4 | -1 | 2 | 5 | 8 | 11 | 14 | 17 | -44 | -9 | -6 |
| Integrator 24 output | 0 | 3 | 6 | 9 | 12 | 15 | -46 | -11 | -8 | -5 | -2 | 1 | 4 | 7 | 10 | 13 | 16 | 19 | -42 | -7 | -4 | -1 | 2 | 5 | 8 | 11 | 14 | 17 | -44 | -9 | -6 | -3 |
| Integrator 25 input | 0 | 3 | 6 | 9 | 12 | 15 | -46 | -11 | -8 | -5 | -2 | 1 | 4 | 7 | 10 | 13 | 16 | 19 | -42 | -7 | -4 | -1 | 2 | 5 | 8 | 11 | 14 | 17 | -44 | -9 | -6 | -3 |
| Integrator 25 data latch | 0 | 0 | 3 | 9 | 18 | 30 | 45 | -1 | -12 | -20 | -25 | -27 | -26 | -22 | -15 | -5 | 8 | 24 | 43 | 1 | -6 | -10 | -11 | -9 | -4 | 4 | 15 | 29 | 46 | 2 | -7 | -13 |
| Integrator 25 output | 0 | 3 | 9 | 18 | 30 | 45 | -1 | -12 | -20 | -25 | -27 | -26 | -22 | -15 | -5 | 8 | 24 | 43 | 1 | -6 | -10 | -11 | -9 | -4 | 4 | 15 | 29 | 46 | 2 | -7 | -13 | -16 |
| Quantizer 26 input | 0 | 3 | 9 | 18 | 30 | 45 | -1 | -12 | -20 | -25 | -27 | -26 | -22 | -15 | -5 | 8 | 24 | 43 | 1 | -6 | -10 | -11 | -9 | -4 | 4 | 15 | 29 | 46 | 2 | -7 | -13 | -16 |
| Quantizer 26 output b(t) | 0 | 0 | 0 | 0 | 1 | 1 | 0 | 0 | 0 | 0 | 0 | 0 | 0 | 0 | 0 | 0 | 1 | 1 | 0 | 0 | 0 | 0 | 0 | 0 | 0 | 0 | 1 | 1 | 0 | 0 | 0 | 0 |
| Data latch 28 output | 0 | 0 | 0 | 0 | 0 | 0 | 1 | 1 | 0 | 0 | 0 | 0 | 0 | 0 | 0 | 0 | 0 | 1 | 1 | 0 | 0 | 0 | 0 | 0 | 0 | 0 | 0 | 1 | 1 | 0 | 0 | 0 |
| Multiplier 27 output | 0 | 0 | 0 | 0 | 0 | 2 | 0 | 0 | 0 | 0 | 0 | 0 | 0 | 0 | 0 | 0 | 0 | 0 | 2 | 0 | 0 | 0 | 0 | 0 | 0 | 0 | 0 | 0 | 2 | 0 | 0 | 0 |
| Multiplier 30 input | 0 | 0 | 0 | 0 | 0 | -2 | 1 | 0 | 0 | 0 | 0 | 0 | 0 | 0 | 0 | 0 | 0 | 0 | -2 | 1 | 0 | 0 | 0 | 0 | 0 | 0 | 0 | -2 | 1 | 0 | 0 | 0 |
| Multiplier 27 output | 0 | 0 | 0 | 0 | 0 | -64 | 32 | 0 | 0 | 0 | 0 | 0 | 0 | 0 | 0 | 0 | 0 | 0 | -64 | 32 | 0 | 0 | 0 | 0 | 0 | 0 | 0 | -64 | 32 | 0 | 0 | 0 |

FIG. 3

| | t0 | t1 | t2 | t3 | t4 | t5 | t6 | t7 | t8 | t9 | t10 | t11 | t12 | t13 | t14 | t15 | t16 | t17 | t18 | t19 | t20 | t21 | t22 | t23 | t24 | t25 | t26 | t27 | t28 | t29 | t30 | t31 |
|---|---|---|---|---|---|---|---|---|---|---|---|---|---|---|---|---|---|---|---|---|---|---|---|---|---|---|---|---|---|---|---|---|
| L | 32 | 32 | 32 | 32 | 32 | 32 | 32 | 32 | 32 | 32 | 32 | 32 | 32 | 32 | 32 | 32 | 32 | 32 | 32 | 32 | 32 | 32 | 32 | 32 | 32 | 32 | 32 | 32 | 32 | 32 | 32 | 32 |
| K | 3 | 3 | 3 | 3 | 3 | 3 | 3 | 3 | 3 | 3 | 3 | 3 | 3 | 3 | 3 | 3 | 3 | 3 | 3 | 3 | 3 | 3 | 3 | 3 | 3 | 3 | 3 | 3 | 3 | 3 | 3 | 3 |
| Integrator 34 input | 3 | 3 | 3 | 3 | 3 | 3 | 3 | 3 | 3 | 3 | 3 | 3 | 3 | 3 | 3 | 3 | 3 | 3 | 3 | 3 | 3 | 3 | -29 | 3 | 3 | 3 | 3 | 3 | 3 | 3 | 3 | 3 |
| Integrator 34 data latch output | 0 | 3 | 6 | 9 | 12 | 15 | 18 | 21 | 24 | 27 | 30 | 33 | 4 | 7 | 10 | 13 | 16 | 19 | 22 | 25 | 28 | 31 | 34 | 5 | 8 | 11 | 14 | 17 | 20 | 23 | 26 | 29 |
| Integrator 34 output | 3 | 6 | 9 | 12 | 15 | 18 | 21 | 24 | 27 | 30 | 33 | 4 | 7 | 10 | 13 | 16 | 19 | 22 | 25 | 28 | 31 | 34 | 5 | 8 | 11 | 14 | 17 | 20 | 23 | 26 | 29 | 32 |
| Quantizer 35 input | 3 | 6 | 9 | 12 | 15 | 18 | 21 | 24 | 27 | 30 | 33 | 4 | 7 | 10 | 13 | 16 | 19 | 22 | 25 | 28 | 31 | 34 | 5 | 8 | 11 | 14 | 17 | 20 | 23 | 26 | 29 | 32 |
| Quantizer 35 output b1(t) | 0 | 0 | 0 | 0 | 0 | 0 | 0 | 0 | 0 | 0 | 1 | 0 | 0 | 0 | 0 | 0 | 0 | 0 | 0 | 0 | 0 | 1 | 0 | 0 | 0 | 0 | 0 | 0 | 0 | 0 | 0 | 1 |
| Data latch 37 output | 0 | 0 | 0 | 0 | 0 | 0 | 0 | 0 | 0 | 0 | 0 | 1 | 0 | 0 | 0 | 0 | 0 | 0 | 0 | 0 | 0 | 0 | 1 | 0 | 0 | 0 | 0 | 0 | 0 | 0 | 0 | 0 |
| Multiplier 38 input | 0 | 0 | 0 | 0 | 0 | 0 | 0 | 0 | 0 | 0 | 0 | 32 | 0 | 0 | 0 | 0 | 0 | 0 | 0 | 0 | 0 | 0 | 32 | 0 | 0 | 0 | 0 | 0 | 0 | 0 | 0 | 0 |
| Adder 41 output | 3 | 6 | 9 | 12 | 15 | -14 | 21 | -8 | -5 | -2 | -31 | 4 | 7 | 10 | 13 | -16 | 19 | -10 | -7 | 28 | -1 | -30 | 5 | 8 | -21 | 14 | 17 | -12 | -9 | 26 | -3 | -32 |
| Integrator 42 input | 3 | 6 | 9 | 12 | 15 | -14 | 21 | -8 | -5 | -2 | -31 | 4 | 7 | 10 | 13 | -16 | 19 | -10 | -7 | 28 | -1 | -30 | 5 | 8 | -21 | 14 | 17 | -12 | -9 | 26 | -3 | -32 |
| Integrator 42 data latch output | 0 | 3 | 9 | 18 | 30 | 45 | 31 | 52 | 44 | 39 | 37 | 6 | 10 | 17 | 27 | 40 | 24 | 43 | 33 | 26 | 54 | 53 | 23 | 28 | 36 | 15 | 29 | 46 | 34 | 25 | 51 | 48 |
| Integrator 42 output | 3 | 9 | 18 | 30 | 45 | 31 | 52 | 44 | 39 | 37 | 6 | 10 | 17 | 27 | 40 | 24 | 43 | 33 | 26 | 54 | 53 | 23 | 28 | 36 | 15 | 29 | 46 | 34 | 25 | 51 | 48 | 16 |
| Quantizer 43 input | 3 | 9 | 18 | 30 | 45 | 31 | 52 | 44 | 39 | 37 | 6 | 10 | 17 | 27 | 40 | 24 | 43 | 33 | 26 | 54 | 53 | 23 | 28 | 36 | 15 | 29 | 46 | 34 | 25 | 51 | 48 | 16 |
| Quantizer 43 output b2(t) | 0 | 0 | 0 | 0 | 1 | 0 | 1 | 1 | 1 | 1 | 0 | 0 | 0 | 0 | 1 | 0 | 1 | 1 | 0 | 1 | 1 | 0 | 0 | 1 | 0 | 0 | 1 | 1 | 0 | 1 | 1 | 0 |
| Data latch 45 output | 0 | 0 | 0 | 0 | 0 | 1 | 0 | 1 | 1 | 1 | 1 | 0 | 0 | 0 | 0 | 1 | 0 | 1 | 1 | 0 | 1 | 1 | 0 | 0 | 1 | 0 | 0 | 1 | 1 | 0 | 1 | 1 |
| Multiplier 46 output | 0 | 0 | 0 | 0 | 0 | 32 | 0 | 32 | 32 | 32 | 32 | 0 | 0 | 0 | 0 | 32 | 0 | 32 | 32 | 0 | 32 | 32 | 0 | 0 | 32 | 0 | 0 | 32 | 32 | 0 | 32 | 32 |
| Differentiator 44 input | 0 | 0 | 0 | 0 | 1 | 0 | 1 | 1 | 1 | 1 | 0 | 0 | 0 | 0 | 1 | 0 | 1 | 1 | 0 | 1 | 1 | 0 | 0 | 1 | 0 | 0 | 1 | 1 | 0 | 1 | 1 | 0 |
| Differentiator 44 data latch input | 0 | 0 | 0 | 0 | 0 | 1 | 0 | 1 | 1 | 1 | 1 | 0 | 0 | 0 | 0 | 1 | 0 | 1 | 1 | 0 | 1 | 1 | 0 | 0 | 1 | 0 | 0 | 1 | 1 | 0 | 1 | 1 |
| Differentiator 44 output | 0 | 0 | 0 | 0 | 1 | -1 | 1 | 0 | 0 | 0 | -1 | 0 | 0 | 0 | 1 | -1 | 1 | 0 | -1 | 1 | 0 | -1 | 0 | 1 | -1 | 0 | 1 | 0 | -1 | 1 | 0 | -1 |
| Delta-sigma 32 output | 0 | 0 | 0 | 0 | 1 | -1 | 1 | 0 | 0 | 0 | -1 | 0 | 0 | 0 | 1 | -1 | 1 | 0 | -1 | 1 | 0 | -1 | 0 | 1 | -1 | 0 | 1 | 0 | -1 | 1 | 0 | 0 |

FIG. 5

SEMICONDUCTOR APPARATUS AND RADIO CIRCUIT APPARATUS USING THE SAME

TECHNICAL FIELD

The present invention relates to a semiconductor apparatus that can produce a signal of predetermined frequency from the output signal of an signal source with a simple configuration, and to a radio circuit apparatus that uses the semiconductor apparatus.

BACKGROUND ART

FIG. 14 shows a simplified exemplary configuration of a conventional radio circuit apparatus. Only the desired reception band of a signal received by an antenna 1 is input to a low noise amplifier 3 via an antenna sharing device 2. The signal amplified by the low noise amplifier 3 is input to an orthogonal demodulator 4. The orthogonal demodulator 4 orthogonally demodulates the amplified signal using a local signal (frequency f2) supplied from a reception PLL circuit 100b and a signal obtained by phase shifting the local signal with a 90° phase shifter 5, and obtains a baseband signal I/Q from which the carrier component has been eliminated.

The reception PLL circuit 100b is composed of a voltage-controlled oscillator 101, a low-pass filter 102, a phase detector 103 and a frequency divider 104b, and outputs the signal of frequency f2 obtained by multiplying the frequency of the output signal of a TCXO (temperature controlled crystal oscillator) 105 by a frequency division ratio B of the frequency divider 104b.

An orthogonal modulator 106 on the transmission side uses the baseband signal I/Q to modulate a carrier signal composed of a local signal (frequency f1) supplied from a transmission PLL circuit 100a and a signal obtained by phase shifting the local signal with a 90° phase shifter 107, and outputs the result. The output of the orthogonal modulator 106 is amplified by a power amplifier 10 and supplied to the antenna sharing device 2. Only the desired transmission band is transmitted to the antenna 1 by the antenna sharing device 2.

The transmission PLL circuit 100a, similarly to the reception PLL circuit 100b, is composed of a voltage-controlled oscillator 101, a low-pass filter 102, a phase detector 103 and a frequency divider 104a, and outputs a signal of frequency f1 obtained by multiplying the frequency of the output signal of the TCXO 105 by a frequency division ratio A of the frequency divider 104a.

Note that in both the transmission PLL circuit 100a and the reception PLL circuit 100b, the frequency division ratios A and B are set in accordance with the channel of the desired frequency.

Incidentally, a configuration using a delta-sigma modulator (Δ-Σ modulator; also referred to as a sigma-delta modulator (Σ-Δ modulator)) in order to precisely obtain the output frequency of a frequency synthesizer that uses PLL circuits at small frequency intervals is disclosed in patent document 1, for example. This is a method that realizes a dividing ratio with decimal point accuracy as average data by periodically changing the dividing ratio. The delta-sigma modulator is used in order to periodically change the dividing ratio.

Patent document 1 further discloses a configuration that is able to add the modulation component to data for fractional control supplied to the delta-sigma modulator (see patent document 1, FIG. 17). A configuration thereby is obtained in which a frequency synthesizer using PLL circuits combines the function of an orthogonal modulator that performs modulation using a baseband signal I/Q with the generation of local signals.

Patent Document 1: JP 2001-237709A
Non-patent Document 1: "A 17-bit Oversampling D-to-A Conversion Technology using Multistage Noise Shaping," IEEE Journal of Solid-State Circuits, Vol. 24, No. 4, August 1989, p. 971, FIG. 4

DISCLOSURE OF INVENTION

Problem to be Solved by the Invention

While radio circuit apparatuses have become smaller, more highly integrated and lower in cost with the rapid advances in mobile telephones, this demand has further accelerated. However, with a conventional configuration, dedicated PLL circuits are required for transmission and reception in the case of a radio circuit apparatus that transmits and receives simultaneously. With PLL circuits, there is a limit to chip size reduction owing to the use of a large number of bipolar transistors that are not easily miniaturized, thereby preventing cost reduction.

With the configuration disclosed in patent document 1, on the other hand, the use of frequency dividers controlled by a delta-sigma modulator in the PLL loop inevitably means that dedicated transmission and reception PLL circuits are required.

An object of the present invention is to provide a semiconductor apparatus that can easily convert a signal output by a single signal source to a signal of predetermined frequency and supply a plurality of signals of predetermined frequency using a simple configuration with reduced chip size. A further object of the present invention is to provide a radio circuit apparatus having a compact configuration as a result of using a semiconductor apparatus such as the above.

Means for Solving Problem

A semiconductor apparatus of the present invention includes a signal source that outputs a signal of predetermined frequency, a frequency divider that receives the output signal of the signal source and is capable of switching the output signal to two or more frequency division ratios, a delta-sigma modulator that controls the frequency division ratio of the frequency divider, and a bandpass filter that receives an output of the frequency divider. A frequency of the input signal of the frequency divider is divided by the frequency division ratio controlled by the delta-sigma modulator, and quantization noise appearing in the output of the frequency divider generated by the delta-sigma modulator is attenuated with the bandpass filter.

A radio circuit apparatus of the present invention includes a signal source that outputs a signal of predetermined frequency, a frequency divider that receives the output signal of the signal source and is capable of switching the output signal to two or more frequency division ratios, a delta-sigma modulator that controls the frequency division ratio of the frequency divider, and a bandpass filter that receives an output of the frequency divider. A frequency of the input signal of the frequency divider is divided by the frequency division ratio controlled by the delta-sigma modulator, and quantization noise appearing in the output of the frequency divider generated by the delta-sigma modulator is attenuated with the bandpass filter. Also, an output signal of the bandpass filter is used as a carrier wave.

Effects of the Invention

According to the above configuration, it is possible to supply a plurality of quality signals of predetermined frequency with a simple configuration having reduced chip size, because delta-sigma noise that occurs when the frequency of a single PLL output is divided by a frequency divider provided with a delta-sigma modulator is attenuated by passing the output of the frequency divider through a bandpass filter.

BRIEF DESCRIPTION OF DRAWINGS

FIG. 3 shows the operations of the frequency divider and the delta-sigma modulator.

FIG. 5 shows the operations of the frequency divider and the delta-sigma modulator.

Figure 1:
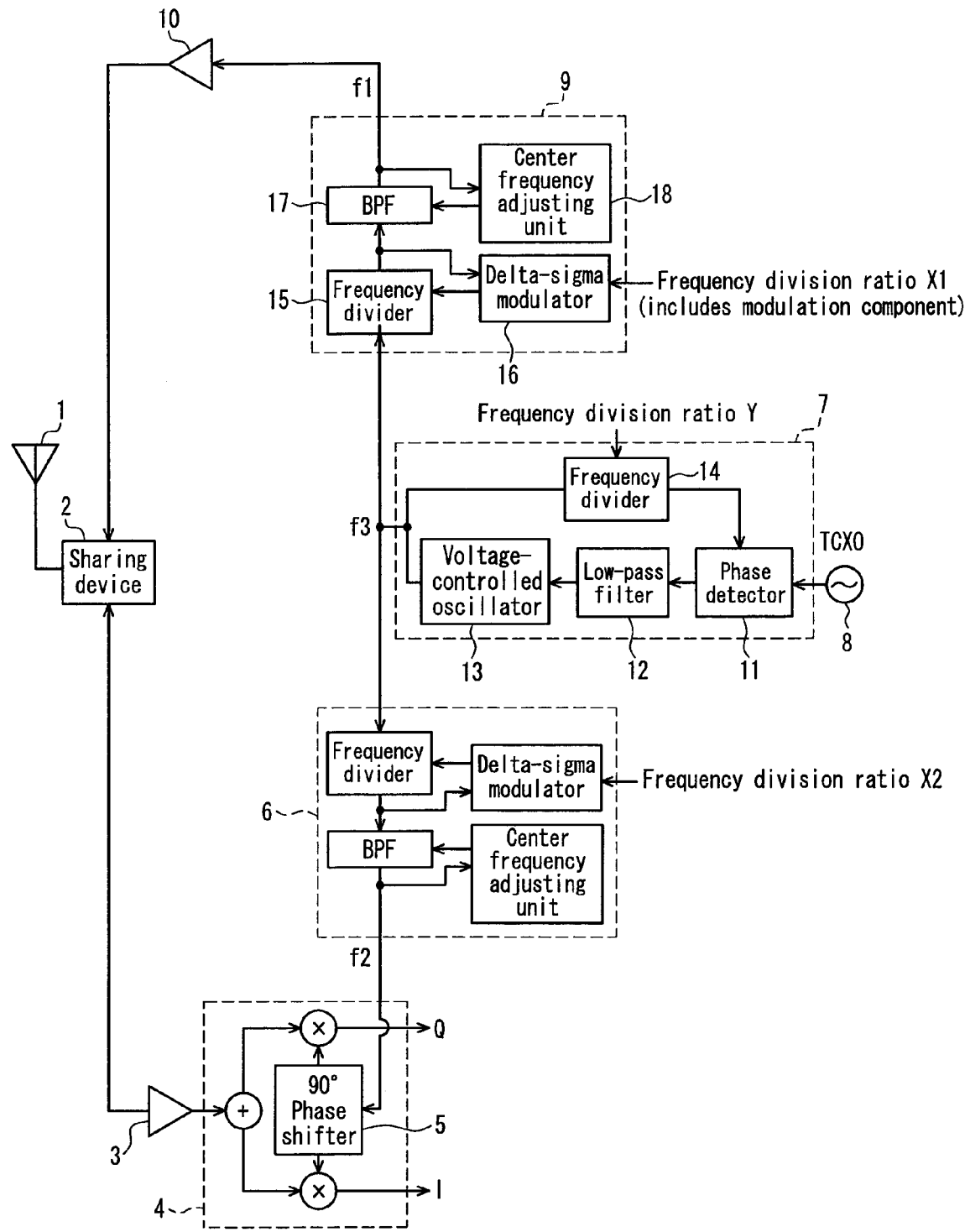
FIG. 1 is a block diagram showing the configuration of a radio circuit apparatus according to Embodiment 1 of the present invention.

DESCRIPTION OF REFERENCE NUMERALS 1 antenna
2 antenna sharing device
3 low noise amplifier
4 orthogonal demodulator
5 90° phase shifter
6 signal generation circuit for reception
7 PLL circuit
8 TCXO
9 signal generation circuit for transmission
10 power amplifier
11 phase detector
12 low-pass filter
13 voltage-controlled oscillator
14 frequency divider
15 frequency divider
16 delta-sigma modulator
17, 17a, 17b BPF (bandpass filter)
18, 18a, 18b center frequency adjusting unit
20 dual modulus frequency divider
21 delta-sigma modulator
22, 36 adder
23, 28, 37, 45 delay circuit
24, 25, 34, 42 integrator
26, 35, 43 quantizer
27, 30, 38, 39, 46 multiplier
29, 33, 40, 41 subtractor
31 triple modulus frequency divider
32 delta-sigma modulator
44 differentiating circuit
50, 54 DA converter
51 amplitude detection circuit
52 comparator
53, 58 control circuit
55 first counter
56 second counter
57 phase comparator
58 control circuit
59 orthogonal modulator
60 frequency detecting unit
61 first frequency division ratio correcting unit
62 second frequency division ratio correcting unit
63 fixed frequency divider
100a transmission PLL circuit
100b reception PLL circuit
101 voltage-controlled oscillator
102 low-pass filter
103 phase detector
104a, 104b frequency divider
105 TCXO
106 orthogonal modulator
107 90° phase shifter
f1 transmission local signal
f2 reception local signal
f3 PLL output signal
fDin frequency divider input signal
fDout frequency divider output signal

DESCRIPTION OF THE INVENTION

It is preferable that the semiconductor apparatus of the present invention further includes a frequency characteristic adjusting unit that adjusts a frequency characteristic of the bandpass filter, and the frequency characteristic adjusting unit adjusts the frequency characteristic of the bandpass filter to be in a predetermined state relative to the signal input from the frequency divider.

An LC resonator can be used in the bandpass filter.

A voltage-controlled variable capacitor can be used in the LC resonator.

The frequency characteristic adjusting unit can be configured to adjust the frequency characteristic of the bandpass filter based on an amplitude of the output signal of the frequency divider.

The frequency characteristic adjusting unit can be configured to adjust the frequency characteristic of the bandpass filter based on a frequency of the output signal of the frequency divider.

The frequency characteristic adjusting unit can be configured to operate if an amplitude of the output signal of the frequency divider is at or below a set value or if a frequency of the output signal of the frequency divider deviates from a set frequency, other than when an adjustment instruction is input.

The semiconductor apparatus of the present invention can be configured to further include a frequency detector that detects a frequency of the signal input to the frequency divider, and the frequency division ratio of the frequency divider can be adjusted according to the detection output.

The radio circuit apparatus of the present invention preferably further includes a frequency characteristic adjusting unit that adjusts a frequency characteristic of the bandpass filter, and the frequency characteristic adjusting unit preferably adjusts the frequency characteristic of the bandpass filter to be in a predetermined state relative to the signal input from the frequency divider.

A modulation component can be added to the frequency division ratio of the frequency divider controlled by the delta-sigma modulator.

The radio circuit apparatus of the present invention can be configured to include a plurality of frequency converting units each including the frequency divider, the bandpass filter and the delta-sigma modulator, and the output signal of the single signal source can be supplied to each of the plurality of frequency converting units.

The semiconductor apparatus or radio circuit apparatus of the present invention can be configured further to include a fixed frequency divider between the frequency divider and the bandpass filter, and quantization noise appearing in the output of the fixed frequency divider generated by the delta-sigma modulator can be attenuated by the bandpass filter.

Hereinafter, embodiments of the present invention will be described in detail with reference to the drawings.

Embodiment 1

The configuration of a radio circuit apparatus according to Embodiment 1 of the present invention will be described with reference to FIG. 1. Only the desired reception band of a signal received by an antenna 1 is input to a low noise amplifier 3 via an antenna sharing device 2. The signal amplified by the low noise amplifier 3 is input to an orthogonal demodulator 4. The orthogonal demodulator 4 orthogonally demodulates the amplified signal using a reception local signal (frequency f2) supplied from a signal generation circuit for reception 6 and a signal obtained by phase shifting the reception local signal with a 90° phase shifter 5, and obtains a baseband signal I/Q from which the carrier component has been eliminated.

The signal generation circuit for reception 6 divides the frequency of a signal of frequency f3 supplied from a PLL circuit 7 to generate the reception local signal of frequency f2, and supplies the generated signal to the orthogonal demodulator 4.

The PLL circuit 7 divides the frequency of the output signal of a TCXO 8 to generate the signal of frequency f3, and supplies the generated signal to the above signal generation circuit for reception 6 and a signal generation circuit for transmission 9 described hereinafter.

The signal generation circuit for transmission 9 outputs a signal obtained by dividing the frequency of and modulating the signal of frequency f3 supplied from the PLL circuit 7. Specifically, the signal generation circuit for transmission 9 combines the function of the conventional orthogonal modulator 106 shown in FIG. 14 with the generation of local signals. The orthogonal modulator 106 shown in FIG. 14 functions to perform phase modulation according to an input I/Q signal and superimpose the phase modulated signal on a local signal, which is a high frequency signal. To provide the signal generation circuit for transmission 9 with this function, a configuration is adopted that enables the modulation component to be added to the frequency division ratio. The output of the signal generation circuit for transmission 9 is output to the power amplifier 10, and an amplified transmission signal is supplied to the antenna sharing device 2. Only the desired transmission band is transmitted to the antenna 1 by the antenna sharing device 2.

The above element circuits will be described in detail next.

The PLL circuit 7 is constituted by a phase detector 11, a low-pass filter 12, a voltage-controlled oscillator 13, and a frequency divider 14. The phase detector 11 detects the frequency of a reference signal output by the TCXO 8 and a signal obtained by dividing the frequency of the output signal of the voltage-controlled oscillator 13 with the frequency divider 14 and the phase difference therebetween, and transmits an output signal of voltage or current that depends on the detection result to the low-pass filter 12. The low-pass filter 12 passes only the low frequency component of the input signal, and only the direct current (DC) signal is transmitted to the voltage-controlled oscillator 13. The voltage-controlled oscillator 13 outputs a frequency that depends on the input DC signal. As a result of this control, the frequency f3 of the PLL output signal equals the frequency of the TCXO 8 multiplied by a frequency division ratio Y set in the frequency divider 14.

The signal generation circuit for transmission 9 and the signal generation circuit for reception 6 will be described next. While the basic configuration and functions of these circuits are the same, and they simply respectively divide the frequency of the PLL output signal (f3) according to input frequency division ratios X1 and X2, a feature is the inclusion of decimal points in these frequency division ratios.

The signal generation circuit for transmission 9 is composed of a frequency divider 15, a delta-sigma modulator 16, a BPF (bandpass filter) 17, and a center frequency adjusting unit 18. The signal of frequency f3 is supplied to the frequency divider 15 from the PLL circuit 7. The frequency division ratio of the frequency divider 15 is controlled by the delta-sigma modulator 16 based on the frequency division ratio X1. The output signal of the frequency divider 15 is output as the signal of frequency f1 via the BPF 17. The output signal of the frequency divider 15 at the same time also is supplied to the delta-sigma modulator 16 and used as an operation clock. The center frequency of the BPF 17 is adjusted by the center frequency adjusting unit 18. The signal generation circuit for reception 6 is constituted similarly.

The signal generation circuit for reception 6 generates a reception local signal (frequency f2) for supplying to the orthogonal demodulator 4. Consequently, the frequency division ratio X2 is obtained by dividing the PLL output signal (f3) by the frequency f2 of the desired channel. The frequency division ratio X2 does not vary provided the PLL outputs signal (f3) and the frequency f2 of the desired channel do not change. In contrast, the signal generation circuit for transmission 9 combines the function of a modulator, in which case, the modulation component is added to the frequency division ratio X1 input to the delta-sigma modulator 16, for example, as with the frequency synthesizer shown in patent document 1, since the signal generation circuit for transmission 9 functions to perform modulation according to the input transmission signal and to superimpose the modulated signal on a high frequency local signal.

However, the signal generation circuit for transmission 9 of the present embodiment has a different configuration from the apparatus disclosed in patent document 1. In patent document 1, the frequency dividers controlled by the delta-sigma modulator are used in the PLL loop, whereas in the present embodiment, the delta-sigma modulator is not used in the PLL loop. Specifically, the frequency of the signal output from the PLL circuit 7 further is divided with the signal generation circuit for transmission 9. The same applies to the signal generation circuit for reception 6. As a result, the present embodiment, in comparison to patent document 1, is advantageous in not requiring the use of dedicated voltage-controlled oscillators for transmission and reception, and being able to achieve a channel switching time of virtually zero when selecting frequency channels. Also, since the majority of the circuitry required instead is formed by CMOS circuits, chip size reduction and higher integration are easy.

Figure 14:
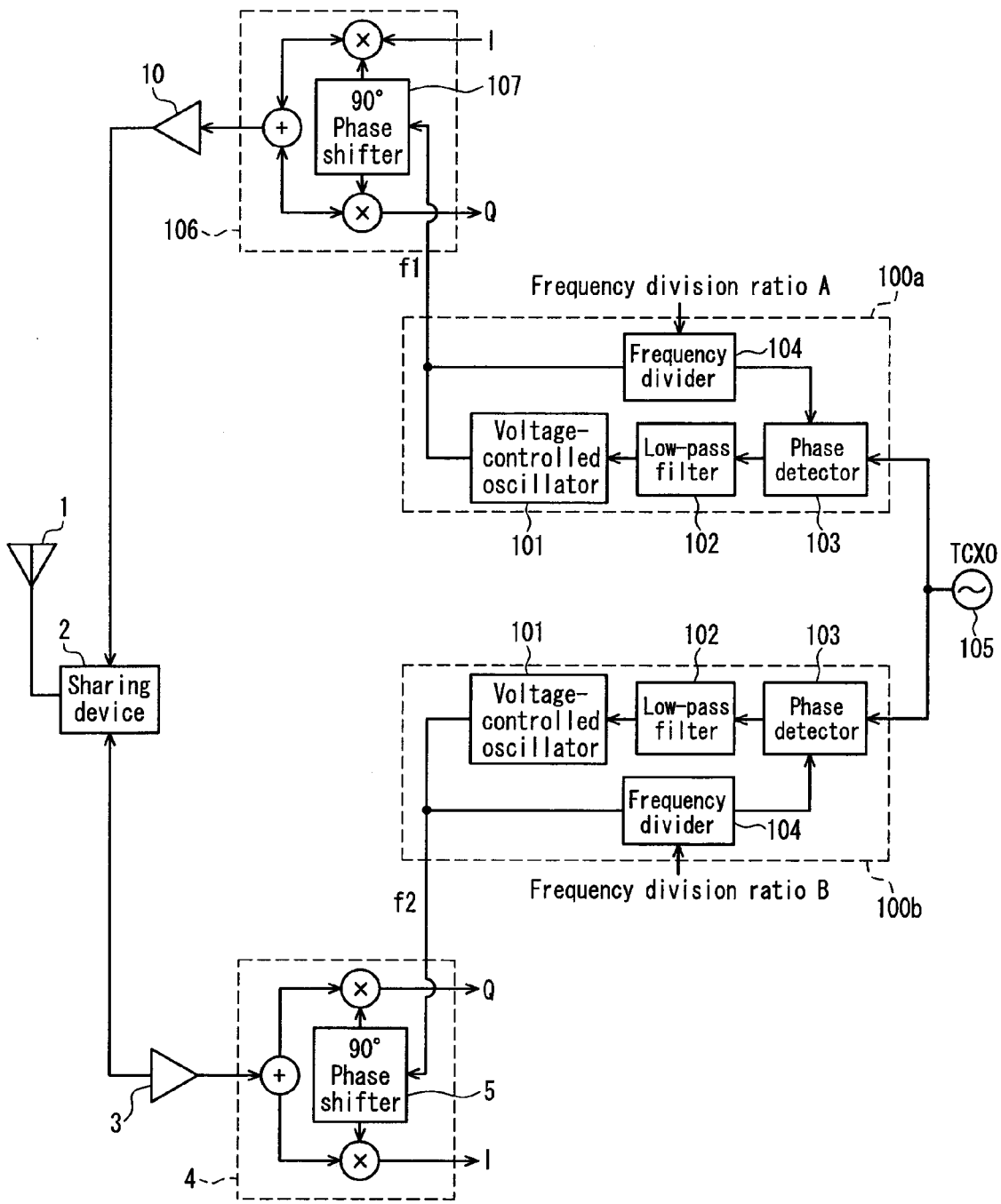
FIG. 14 is a block diagram showing the configuration of a conventional radio circuit apparatus.

With the prior art shown in FIG. 14, there is a trade-off between the phase noise characteristics of the transmission and reception local signals and channel switching time, which is responsive to these, whereas according to the configuration of the present embodiment, channel switching time is virtually nonexistent and also has no effect on the phase noise characteristics, since frequency channels are selected by switching the frequency division ratio of the frequency divider 15.

Next, the configuration and internal operations of the signal generation circuit for transmission 9 and the signal generation circuit for reception 6 will be described in greater detail. The signal generation circuit for transmission 9 will be described here, since both the signal generation circuit for transmission 9 and the signal generation circuit for reception 6 have similar configurations and functions.

Figure 2:
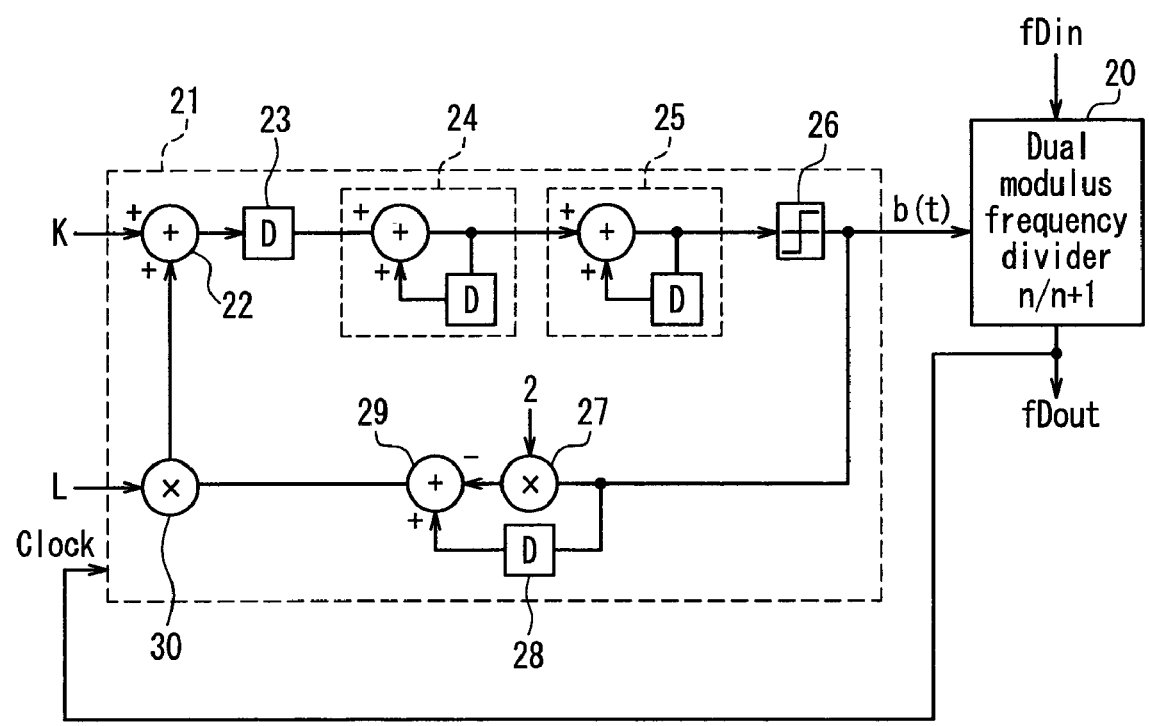
FIG. 2 is a circuit diagram showing a first exemplary configuration of a frequency divider and a delta-sigma modulator constituting the radio circuit apparatus.

A first specific exemplary configuration of the frequency divider 15 and the delta-sigma modulator 16 shown in FIG. 1 will be described firstly, with reference to FIGS. 2 and 3. FIG. 2 is a block circuit diagram showing the configuration of a frequency divider and a delta-sigma modulator. FIG. 3 shows the operations of the delta-sigma modulator.

In this exemplary configuration, a dual modulus frequency divider 20 is used as the frequency divider 15, and a delta-sigma modulator 21 having the configuration disclosed in patent document 1 is used as the delta-sigma modulator 16. The dual modulus frequency divider 20 divides an input frequency (fDin) corresponding to f3 of FIG. 1 to obtain an output frequency (fDout) (supplied to the BPF 17 of FIG. 1). Either n or n+1 (n is a fixed integer) can be selected as the frequency division ratio, with this control being performed by the delta-sigma modulator 21.

The delta-sigma modulator 21 is composed of an adder 22, delay circuits 23 and 28, integrators 24 and 25, a quantizer 26, multipliers 27 and 30, and a subtractor 29. Decimal data K is input to the adder 22, and a quantization step L is input to the multiplier 30.

The frequency division ratio is set to n when the output b(t) of the delta-sigma modulator 21 is "0", and to n+1 when the output b(t) is "1". Under these conditions, the total frequency division ratio is given by (n+1)×K+n (L−K), considering the case in which the frequency division ratio is set to n+1 K times out of L. The average frequency division ratio for one time is given by n+(K/L). A decimal frequency division ratio (K/L) is thus obtained.

In the table of FIG. 3, the state of the signals of the components in FIG. 2 shown vertically is shown for each operation clock shown horizontally. In the table, operations are shown for K=3 and L=32, and the output b(t) of the delta-sigma modulator 21 is "1" 3 times out of 32. Note that the smallest frequency resolution obtained with the configuration of FIG. 2 is given by the input frequency (fDin)×(1/L), and is thus also dependant on the input frequency (fDin). However, with the radio circuit apparatus of the present embodiment, the input frequency (fDin) is constant. Thus, it should be noted that the value of L should be fixed such that the aforementioned smallest frequency resolution is at or below the frequency channel interval of the radio system, and that K should be varied in accordance with the desired frequency channel. While the smallest frequency resolution increases when the value of L is increased, this causes an increase in the bit rate of the operators in the delta-sigma modulator 21 and an increase in power consumption, making it desirable to set (smallest frequency resolution)=(frequency channel interval).

Figure 4:
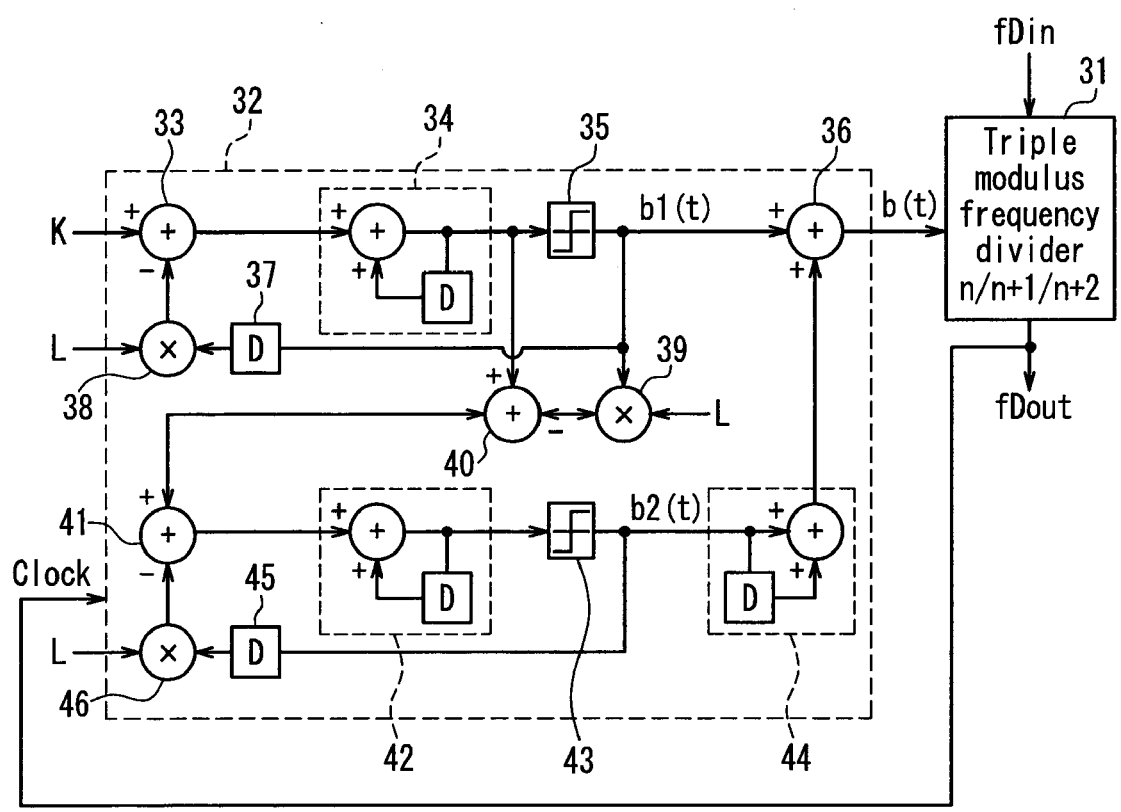
FIG. 4 is a circuit diagram showing a second exemplary configuration of a frequency divider and a delta-sigma modulator constituting the radio circuit apparatus.

A second detailed exemplary configuration of the frequency divider 15 and the delta-sigma modulator 16 shown in FIG. 1 will be described next, with reference to FIGS. 4 and 5. FIG. 4 is a block circuit diagram showing a frequency divider and a delta-sigma modulator. FIG. 5 shows the operations of the delta-sigma modulator. In this exemplary configuration, a triple modulus frequency divider 31 is used as the frequency divider 15, and a delta-sigma modulator 32 having a circuit configuration called a MASH (see non-patent document 1) is used as the delta-sigma modulator 16. The basic operations are similar to the first exemplary configuration.

The triple modulus frequency divider 31 is able to set three frequency division ratios n−1, n, and n+1 (n is a fixed integer). The delta-sigma modulator 32 is composed of subtractors 33, 40 and 41, an adder 36, delay circuits 37 and 45, integrators 34 and 42, quantizers 35 and 43, multipliers 38, 39 and 46, and a differentiating circuit 44. Decimal data K is input to the subtractor 33, and a quantization step L is input to the multipliers 38, 39 and 46.

Here, the frequency division ratio is set to n−1 when the output b(t) of the delta-sigma modulator 32 is "−1", to n when the output b(t) is "0", and to n+1 when the output b(t) is "1". In the table of FIG. 5, the state of the signals of the components in FIG. 4 shown vertically is shown for each operation clock shown horizontally. In the table, the operations are shown for K=3 and L=32, and the output b(t) of the delta-sigma modulator 32 is "−1" 5 times out of 32, "1" 8 times, and "0" for the remainder. Thus, the total frequency division ratio is given by (n−1)×5+n×(32−5−8)+(n+1)×8=32×n+3. The average frequency division ratio for one time is given by n+(3/32), dividing by 32. Thus, a decimal frequency division ratio (K/L) can be obtained, similarly to the first exemplary configuration.

Figure 6:
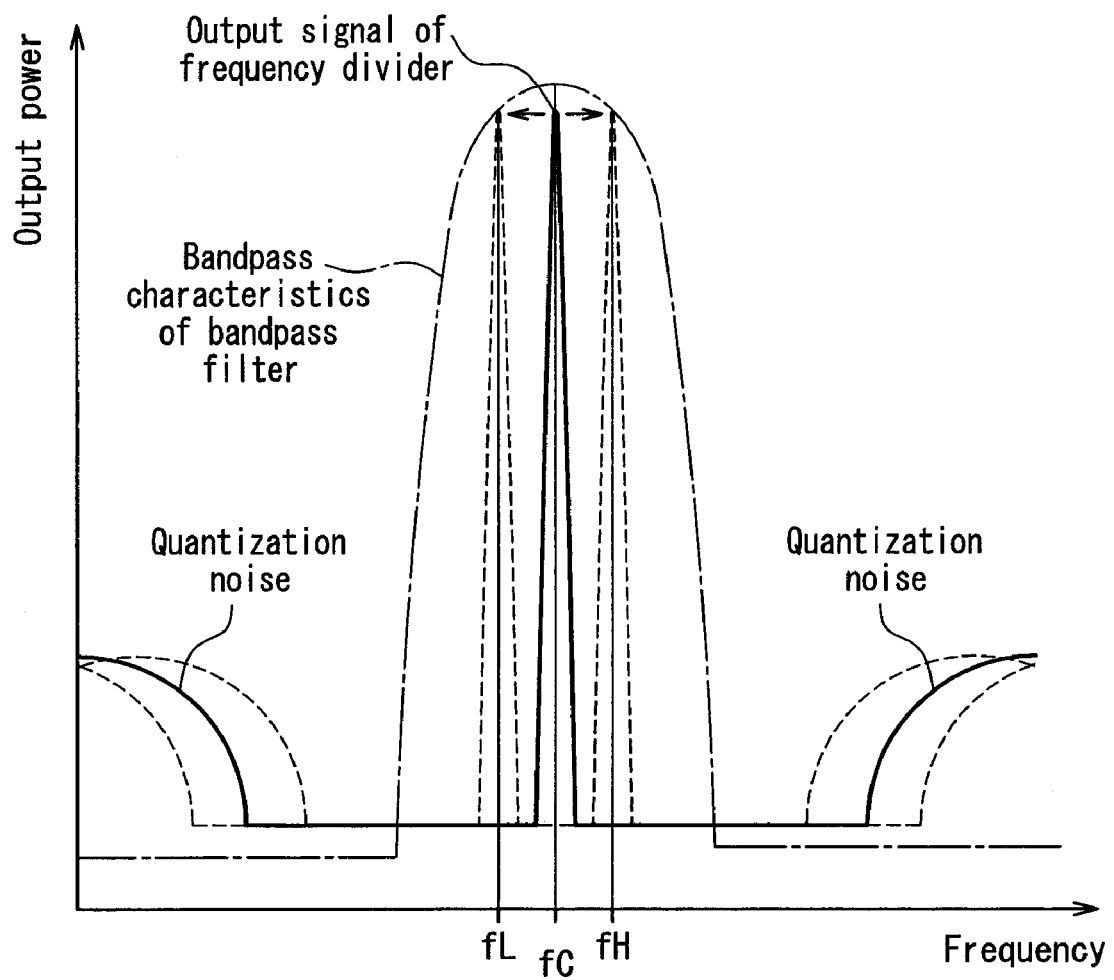
FIG. 6 shows a frequency spectrum illustrating the operations of the radio circuit apparatus.

The bandpass characteristics of the BPF 17 (see FIG. 1) used in the present embodiment will be described next, with reference to FIG. 6. FIG. 6 shows the frequency spectrum of the output signal of the frequency divider 15. The output signal of the frequency divider 15 contains quantization noise peculiar to a delta-sigma modulator such as shown in FIG. 18 of patent document 1. The maximum power point in quantization noise occurring in the frequency closest to the output signal of the frequency divider 15 appears in a frequency detuned by half of the clock frequency of the delta-sigma modulator 16. That is, half of the output frequency of a modulus prescaler. Note that "fL" shown on the horizontal axis of FIG. 6 indicates the lowest frequency used in the radio system, while "fC" and "fH" similarly indicate the center frequency and the highest frequency, respectively. The BPF 17 used in the present embodiment is for attenuating the quantization noise in the delta-sigma modulator 16. The required bandpass characteristics are shown by the dashed-dotted line in FIG. 6. As a result of these bandpass characteristics, only quantization noise is attenuated, enabling only the desired frequency to be used as transmission/reception local signals and transmission modulation signals.

Figure 7:
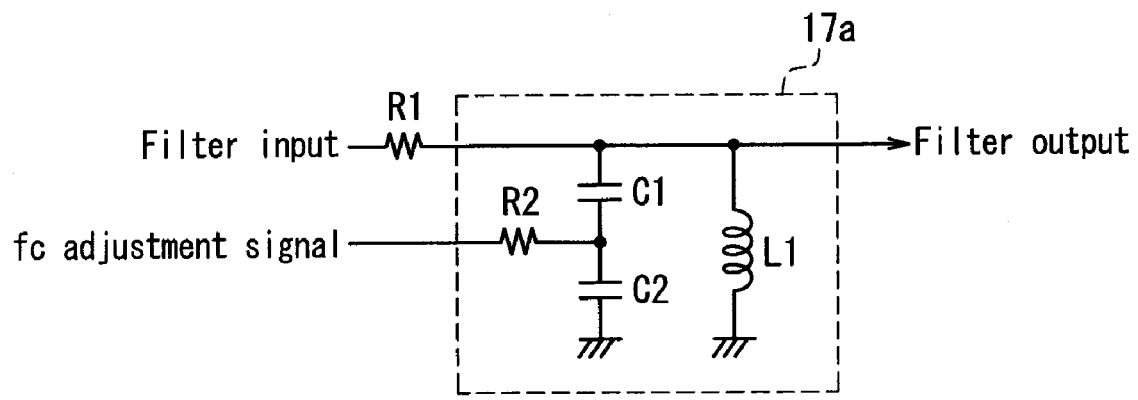
FIG. 7 is a circuit diagram showing a first exemplary configuration of a bandpass filter constituting the radio circuit apparatus.
Figure 8:
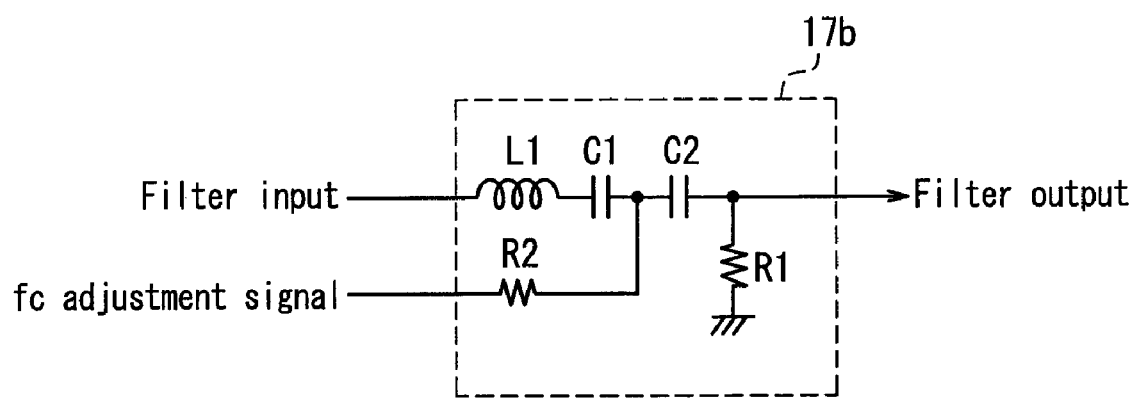
FIG. 8 is a circuit diagram showing a second exemplary configuration of a bandpass filter constituting the radio circuit apparatus.

FIGS. 7 and 8 show BPFs 17*a* and 17*b* as first and second exemplary configurations of the BPF 17 in the present embodiment. A bandpass filter using an LC resonance circuit is used in order to obtain attenuation characteristics such as the above. Specifically, each of the BPFs 17a and 17b is constituted by a capacitor C1, a voltage variable capacitor C2, an inductor L1, and resistors R1 and R2. The reason is that they 1) can be integrated in a semiconductor, 2) can achieve sufficient attenuation, 3) do not consume current because of only being configured by passive components, and 4) allow ready formation of adjustment circuits for absorbing center frequency dispersion in the bandpass characteristics.

The filter input in FIGS. 7 and 8 is the output signal of the frequency divider 15. The filter output is supplied to the orthogonal demodulator 4 or the power amplifier 10, and used as a reception or transmission local signal or as a transmission modulation signal. An fc adjustment signal is a control signal output from the center frequency adjusting unit 18, and is transmitted to the voltage variable capacitor C2. This is to prevent the center frequencies of the BPFs 17a and 17b from deviating due to dispersion in the LC resonance circuit. Note that although the first and second exemplary configurations are different, with one being in parallel while the other is in series, they are similar in terms of using an LC resonance circuit in which impedance is maximized or minimized by the resonance frequency.

The center frequency adjusting unit 18 in the present embodiment will be described next. As aforementioned, if the center frequency of the BPF 17 deviates due to dispersion in the LC resonance circuit or the like, the quantization noise of the delta-sigma modulator 16 included in the output of the frequency divider 15 cannot be sufficiently attenuated. The center frequency of the BPF 17 thus needs to be adjusted.

Figure 9:
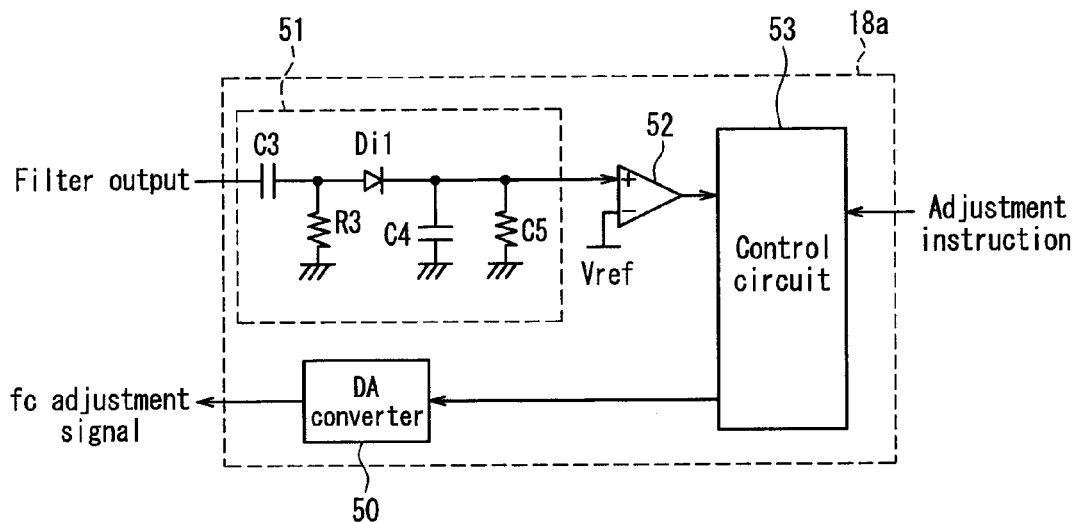
FIG. 9 is a block circuit diagram showing a first exemplary configuration of a center frequency adjusting unit constituting the radio circuit apparatus.

FIG. 9 shows a center frequency adjusting unit 18a of a first exemplary configuration. This center frequency adjusting unit 18a is constituted by a DA converter 50 that outputs an fc adjustment signal for adjusting the LC resonance frequency of the BPF 17, an amplitude detection circuit 51 that converts the amplitude level of the output signal of the BPF 17 to a DC voltage, a comparator 52 that compares the DC voltage output from the amplitude detection circuit 51 with a reference value (Vref), and a control circuit 53 that controls the DA converter 50 according to the comparison result of the comparator 52.

The adjustment operation by this center frequency adjusting unit 18a will be described. Firstly, an adjustment instruction is input to the control circuit 53 when the IC is powered on. The smallest value is input from the control circuit 53 to the DA converter 50. The control circuit 53 then checks the comparison result of the comparator 52. Next, a value larger by one step is input from the control circuit 53 to the DA converter 50. The control circuit 53 then checks the comparison result of the comparator 52. The control circuit 53 thus continues to check the comparison results of the comparator 52 while increasing the value of the DA converter 50 by one step at a time. As a result, the center frequency of the BPF 17 changes according to the fc adjustment signal from the DA converter 50, and the DC voltage output from the amplitude detection circuit 51 only exceeds the reference value (Vref) for periods during which the center frequency of the frequency divider 15 output roughly coincides with the center frequency of the BPF 17.

That is, the output of the comparator 52 has an "H" period after an "L" period, which is followed again by an "L" period. The center frequency of the frequency divider 15 output can be made to coincide with the center frequency of the BPF 17 as a result of the control circuit 53 outputting and holding a value obtained by adding the value of the DA converter 50 when the output of the comparator 52 changes from "L" to "H" to the value of the DA converter 50 when the output of the comparator 52 changes from "H" to "L" and dividing by two.

Note that if the comparator 52 output falls to "L" other than when the IC is powered-on, the control circuit 53 checks the comparison result of the comparator 52 after inputting a value one step larger than the value of the DA converter 50 resulting from adjustment when the IC is powered-on, and then checks the comparison result of the comparator 52 after inputting a value one step smaller than the value of the DA converter 50 resulting from adjustment when the IC is powered-on. Next, the control circuit 53 checks the comparison result of the comparator 52 after inputting a value two steps larger than the value of the DA converter 50 resulting from adjustment when the IC is powered-on, and then checks the comparison result of the comparator 52 after inputting a value two steps smaller than the value of the DA converter 50 resulting from adjustment when the IC is powered-on. The value input to the DA converter 50 thus is changed centering on the value of the DA converter 50 resulting from adjustment when the IC is powered-on, and similar operations are continued until the output of the comparator 52 is "H". Adjustment thus can be performed while shortening the adjustment period.

Note that a limiter amplifier desirably is inserted in the output of the BPF 17. A feature of a limiter amplifier is that the limiter amplifier output amplitude does not fluctuate when an amplitude at or above a specified input level is input. As a result, transmission and reception is possible while adjusting the center frequency of the BPF 17 even where the comparator 52 output falls to "L" other than when the IC is powered on, because there is no fluctuation in the output level of the limiter amplifier even if the bandpass filter output amplitude drops slightly.

Figure 10:
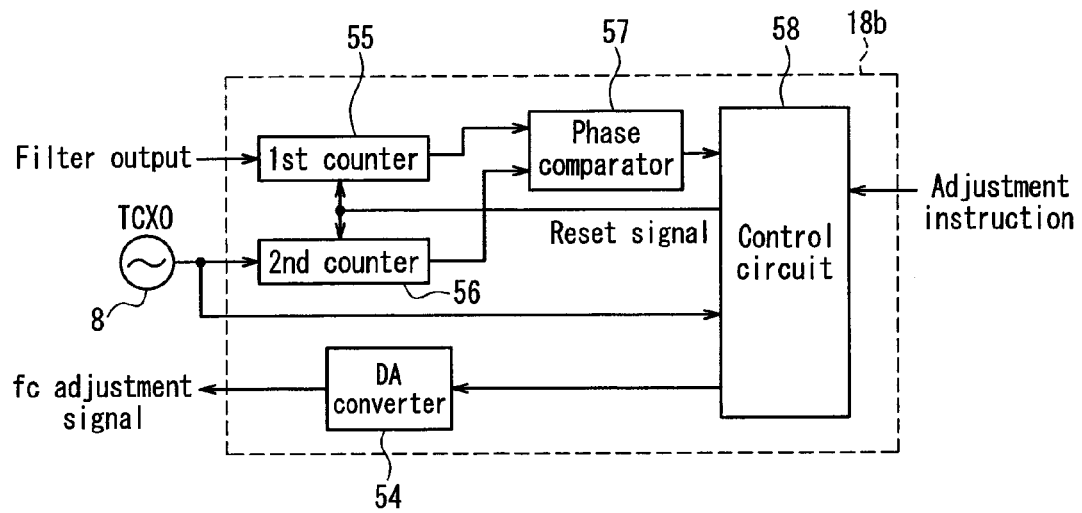
FIG. 10 is a block circuit diagram showing a second exemplary configuration of a center frequency adjusting unit constituting the radio circuit apparatus.

A center frequency adjusting unit 18b of a second exemplary configuration will be described next, with reference to FIG. 10. This center frequency adjusting unit 18b is constituted by a DA converter 54 for adjusting the LC resonance frequency of the BPF 17, a first counter 55 that divides the frequency of the output signal of the BPF 17, a second counter 56 that divides the frequency of the TCXO 8, a phase comparator 57 that compares the phases of the first counter 55 and the second counter 56, and a control circuit 58 that controls the DA converter 54 according to the comparison result of the phase comparator 57.

The adjustment operation by the center frequency adjusting unit 18b will be described next. Firstly, an adjustment instruction is input to the control circuit 58 when the IC is powered on. The smallest value is input from the control circuit 58 to the DA converter 54. The control circuit 58 then checks the comparison result of the phase comparator 57. The phase comparator 57 compares the phases of the first and second counters 55 and 56, and judges whether they are at or below, or greater than a predetermined phase difference. Next, a value larger by one step is input from the control circuit 58 to the DA converter 54. The control circuit 58 then checks the comparison result of the phase comparator 57. The control circuit 58 thus continues to check the comparison results of the phase comparator 57 while increasing the value of the DA converter 55 by one step at a time.

As a result, the center frequency of the BPF 17 changes according to the fc adjustment signal from the DA converter 54. If the amplitude level input to the first counter 55 at this time is not sufficient, the first counter 55 will not operate properly. That is, the phase comparator 57 only judges as the comparison result that the phases of the first and second counters 55 and 56 are at or below the predetermined phase difference for the period during which the center frequency of the frequency divider 15 output roughly coincides with the center frequency of the BPF 17. As a result, the output of the comparison result of the comparator 57 has an "H" period after an "L" period, which is followed again by an "L" period. The center frequency of the frequency divider 15 output can be made to coincide with the center frequency of the BPF 17 as a result of the control circuit 58 outputting and holding a value obtained by adding the value of the DA converter 54 when the comparison result output of the phase comparator 57 changes from "L" to "H" to the value of the DA converter 54 when the output of the phase comparator 57 changes from "H" to "L" and dividing by two. Note that if the phase comparator 57 output falls to "L" other than when the IC is powered-on, the control circuit 58 controls the DA converter 54 to adjust the center frequency of the BPF 17, similarly to the first exemplary configuration.

Figure 11:
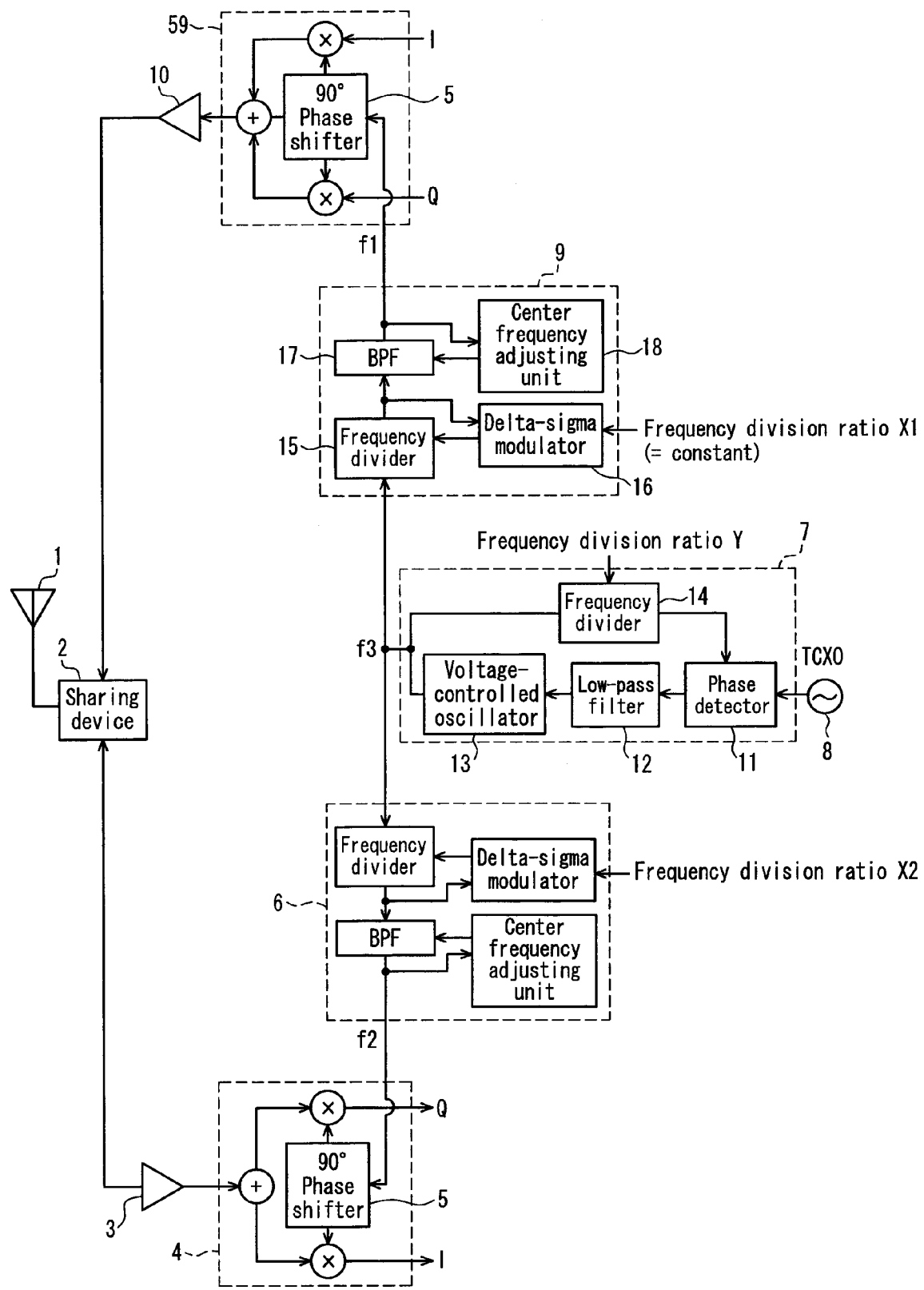
FIG. 11 is a block diagram showing another configuration of the radio circuit apparatus according to Embodiment 1.

Note that in the case of a configuration using an orthogonal modulator such as the conventional radio circuit apparatus of FIG. 14, the frequency division ratio X1 will not vary provided the PLL output signal (f3) and the frequency of the desired channel do not change, similarly to the signal generation circuit for reception 6. The configuration of the radio circuit apparatus in this case is shown in FIG. 11. In this configuration, the output signal of the signal generation circuit for transmission 9 is supplied to the 90° phase shifter 5 of an orthogonal modulator 59. The configuration and operations of the orthogonal modulator 59 are similar to the orthogonal modulator 106 in the prior art shown in FIG. 14. A carrier signal composed of a local signal (frequency f1) supplied from the signal generation circuit for transmission 9 and a signal obtained by phase shifting the local signal with the 90° phase shifter 5 is modulated by a baseband signal I/Q and output.

Embodiment 2

Figure 12:
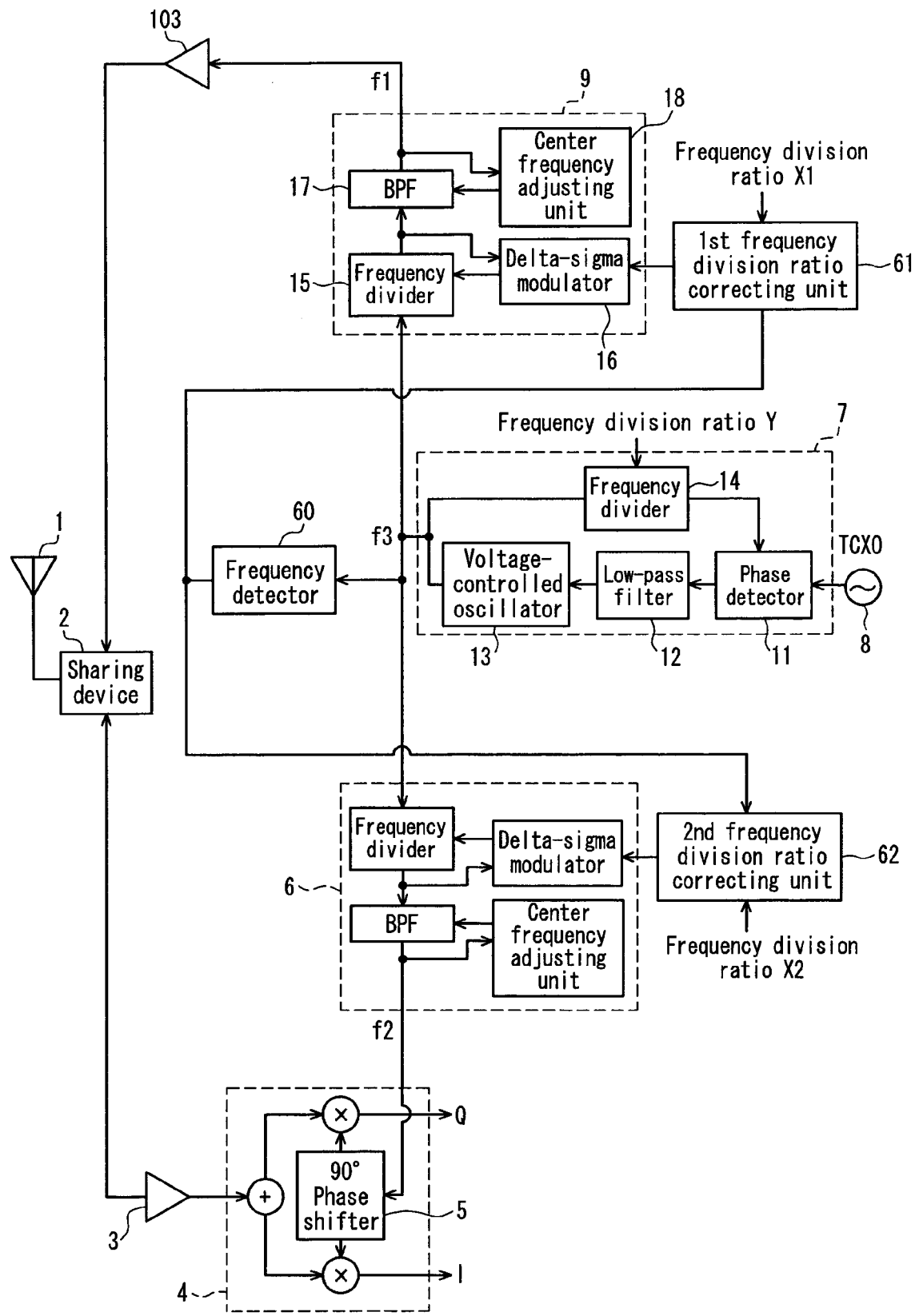
FIG. 12 is a block diagram showing the configuration of a radio circuit apparatus according to Embodiment 2 of the present invention.

The configuration of a radio circuit apparatus according to Embodiment 2 of the present invention is shown in FIG. 12. This radio circuit apparatus includes a frequency detecting unit 60, a first frequency division ratio correcting unit 61 and a second frequency division ratio correcting unit 62, in addition to the configuration of the radio circuit apparatus according to Embodiment 1.

The frequency detecting unit 60 detects the output frequency f3 of the PLL circuit 7, and controls the first frequency division ratio correcting unit 61 and the second frequency division ratio correcting unit 62 to change the values of frequency division ratios X1 and X2 according to the detected frequency, before inputting the changed frequency division ratios X1 and X2 to the delta-sigma modulator 16. Similar effects to the radio circuit apparatus of Embodiment 1 can be obtained thereby even if the output frequency f3 of the PLL circuit 7 changes. This is effective where the voltage-controlled oscillator 13 used by the PLL circuit 7 cannot oscillate at an assumed frequency due to dispersion or the like.

Embodiment 3

Figure 13:
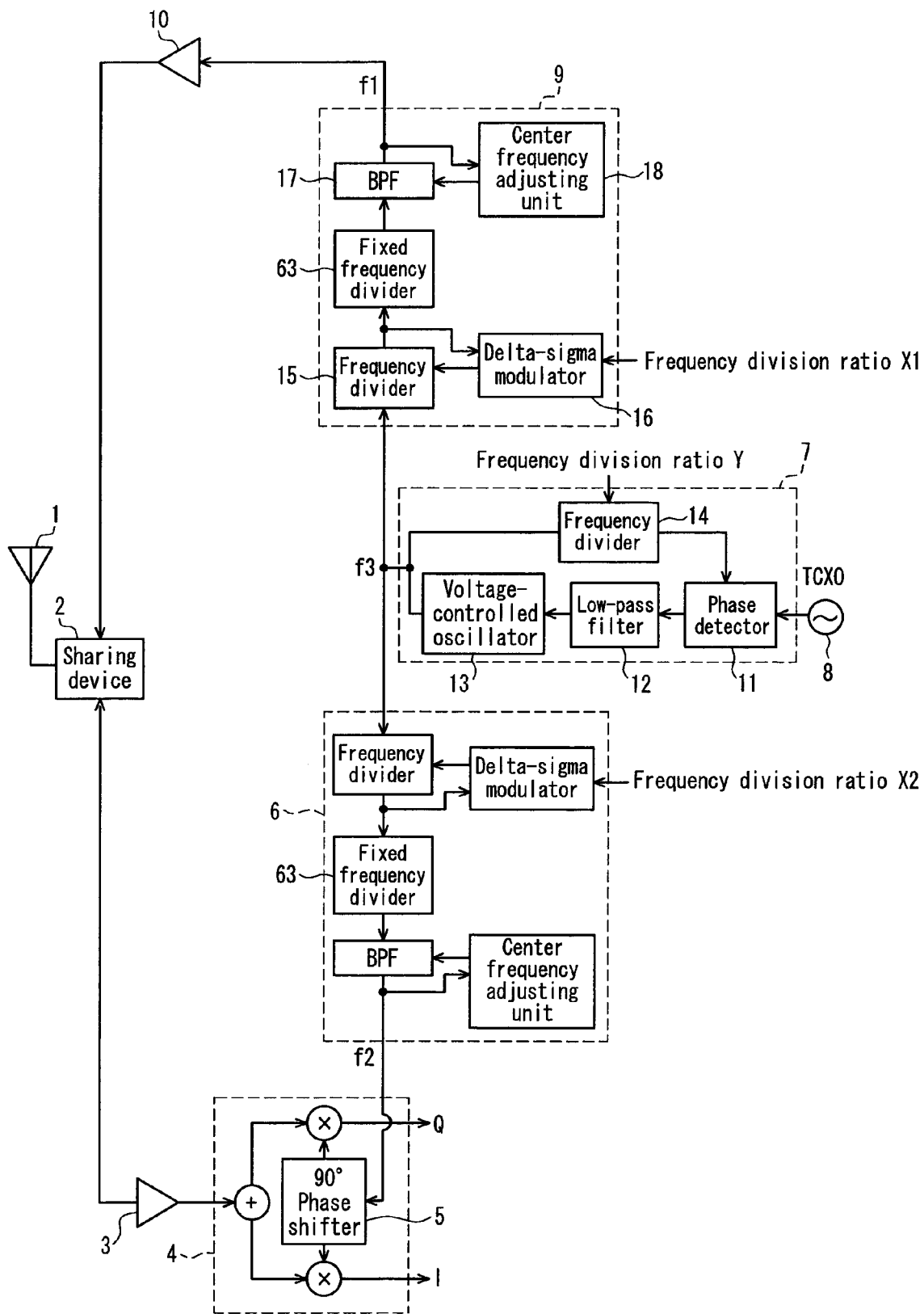
FIG. 13 is a block diagram showing the configuration of a radio circuit apparatus according to Embodiment 3 of the present invention.

The configuration of a radio circuit apparatus according to Embodiment 3 of the present invention is shown in FIG. 13. This radio circuit apparatus is provided with a fixed frequency divider 63, in addition to the configuration of the radio circuit apparatus according to Embodiment 1. The fixed frequency divider 63 is inserted between the frequency divider 15 and the BPF 17 in the signal generation circuit for transmission 9 and the signal generation circuit for reception 6.

The fixed frequency divider 63 divides input frequencies according to a fixed frequency division ratio. Consequently, in order to obtain a transmission local signal (f1) and a reception local signal (f2) of the same frequency as in Embodiment 1, either the frequency of the PLL output signal (f3) is increased by a factor of the frequency division ratio of the fixed frequency divider 63, or the frequency division ratio of the frequency divider 15 is decreased by a factor of the frequency division ratio of the fixed frequency divider 63.

According to this configuration, the clock frequency of the delta-sigma modulator 16 is increased by a factor of the frequency division ratio of the fixed frequency divider 63, in comparison to the configuration of Embodiment 1. Also, as aforementioned, the maximum power point of quantization noise peculiar to the delta-sigma modulator appears in a frequency detuned by half of the clock frequency of the delta-sigma modulator 16. Thus, according to Embodiment 3, the maximum power point of quantization noise appears in a frequency detuned by twice as much, in comparison to the configuration of Embodiment 1. As a result, the attenuation characteristics of the BPF 17 can be alleviated, and the degree of design freedom when realizing the BPF 17 on a semiconductor integrated circuit can be improved.

INDUSTRIAL APPLICABILITY

A semiconductor apparatus of the present invention is able to convert a signal output by a single signal source into a plurality of signals of predetermined frequency using a simple configuration with reduced chip area, and is useful in the configuration of the reception and transmission circuits of a radio circuit apparatus.

The invention claimed is:

1. A semiconductor apparatus comprising:
    a signal source that outputs a signal of predetermined frequency;
    a frequency divider that receives the output signal of the signal source, and is capable of switching the output signal to two or more frequency division ratios;
    a frequency detector that detects a frequency of the signal input to the frequency divider;
    a delta-sigma modulator that controls the frequency division ratio of the frequency divider; and
    a bandpass filter that receives an output of the frequency divider, wherein
    a frequency of the input signal of the frequency divider is divided by the frequency division ratio controlled by the delta-sigma modulator, the frequency division ratio of the frequency divider is adjusted according to a detection output of the frequency detector and quantization noise appearing in the output of the frequency divider generated by the delta-sigma modulator is attenuated with the bandpass filter.

2. The semiconductor apparatus according to claim 1, further comprising a frequency characteristic adjusting unit that adjusts a frequency characteristic of the bandpass filter, wherein
    the frequency characteristic adjusting unit adjusts the frequency characteristic of the bandpass filter to be in a predetermined state relative to signal input from the frequency divider.

3. The semiconductor apparatus according to claim 1, wherein an LC resonator is used in the bandpass filter.

4. The semiconductor apparatus according to claim 3, wherein a voltage-controlled variable capacitor is used in the LC resonator.

5. The semiconductor apparatus according to claim 2, wherein the frequency characteristic adjusting unit adjusts the frequency characteristic of the bandpass filter based on an amplitude of the output signal of the bandpass filter.

6. The semiconductor apparatus according to claim 2, wherein the frequency characteristic adjusting unit adjusts the frequency characteristic of the bandpass filter based on a frequency of the output signal of the bandpass filter.

7. The semiconductor apparatus according to claim 2, wherein the frequency characteristic adjusting unit operates if an amplitude of the output signal of the frequency divider is at or below a set value or if a frequency of the output signal of the frequency divider deviates from a set frequency, except for during a period when an adjustment instruction is input.

8. A radio circuit apparatus comprising:
- a signal source that outputs a signal of predetermined frequency; and
- a plurality of frequency converting units, each of which is supplied with the output signal of the signal source,
- wherein each of the frequency converting units comprises:
- a frequency divider that receives the output signal of the signal source, and is capable of switching the output signal to two or more frequency division ratios;
- a delta-sigma modulator that controls the frequency division ratio of the frequency divider; and
- a bandpass filter that receives an output of the frequency divider, wherein
- a frequency characteristic of the bandpass filter is adjusted according to the amplitude or frequency of output signal from the bandpass filter;
- a frequency of the input signal of the frequency divider is divided by the frequency division ratio controlled by the delta-sigma modulator, and quantization noise appearing in the output of the frequency divider generated by the delta-sigma modulator is attenuated with the bandpass filter, and
- an output signal of the bandpass filter is used as a carrier wave.

9. The radio circuit apparatus according to claim 8, further comprising a frequency characteristic adjusting unit that adjusts a frequency characteristic of the bandpass filter, wherein
the frequency characteristic adjusting unit adjusts the frequency characteristic of the bandpass filter to be in a predetermined state relative to the signal input from the frequency divider.

10. The radio circuit apparatus according to claim 8, wherein a modulation component is added to the frequency division ratio of the frequency divider controlled by the delta-sigma modulator.

11. The radio circuit apparatus according to claim 8, further comprising a fixed frequency divider between the frequency divider and the bandpass filter, wherein quantization noise appearing in the output of the fixed frequency divider generated by the delta-sigma modulator is attenuated with the bandpass filter.

12. A semiconductor apparatus comprising:
- a signal source that outputs a signal of predetermined frequency;
- a frequency divider that receives the output signal of the signal source, and is capable of switching the output signal to two or more frequency division ratios;
- a delta-sigma modulator that controls the frequency division ratio of the frequency divider;
- a bandpass filter that receives an output of the frequency divider; and
- a frequency characteristic adjusting unit that adjusts a frequency characteristic of the bandpass filter to be in a predetermined state relative to the signal input from the frequency divider,
- wherein a frequency of the input signal of the frequency divider is divided by the frequency division ratio controlled by the delta-sigma modulator,
- quantization noise appearing in the output of the frequency divider generated by the delta-sigma modulator is attenuated with the bandpass filter, and
- the frequency characteristic adjusting unit operates if an amplitude of the output signal of the bandpass filter is at or below a set value or if a frequency of the output signal of the bandpass filter deviates from a set frequency, except for during a period when an adjustment instruction is input.

13. The semiconductor apparatus according to claim 12, wherein an LC resonator is used in the bandpass filter.

14. The semiconductor apparatus according to claim 13, wherein a voltage-controlled variable capacitor is used in the LC resonator.

15. The semiconductor apparatus according to claim 12, wherein the frequency characteristic adjusting unit adjusts the frequency characteristic of the bandpass filter based on an amplitude of the output signal of the bandpass filter.

16. The semiconductor apparatus according to claim 12, wherein the frequency characteristic adjusting unit adjusts the frequency characteristic of the bandpass filter based on a frequency of the output signal of the bandpass filter.

17. The semiconductor apparatus according to claim 12, further comprising a fixed frequency divider between the frequency divider and the bandpass filter, wherein
quantization noise appearing in the output of the fixed frequency divider generated by the delta-sigma modulator is attenuated with the bandpass filter.

* * * * *